United States Patent [19]
Kappeler et al.

[11] Patent Number: 4,789,897
[45] Date of Patent: Dec. 6, 1988

[54] FREQUENCY CONVERTING APPARATUS FOR CONVERTING AN RF TELEVISION SIGNAL TO A VIDEO SIGNAL EMPLOYING LOW IF TECHNIQUES

[75] Inventors: Otmar Kappeler, Neuenburg; Dietmar Ehrhardt, Freiburg-Hochdorf, both of Fed. Rep. of Germany

[73] Assignee: Deutsche ITT Industries GmbH, Freiburg, Fed. Rep. of Germany

[21] Appl. No.: 165,660

[22] Filed: Mar. 8, 1988

[30] Foreign Application Priority Data

Mar. 14, 1987 [EP] European Pat. Off. ........ 87103740.4

[51] Int. Cl.$^4$ .......................... H04N 5/14; H04N 5/44
[52] U.S. Cl. ..................... 358/188; 358/23; 358/160; 358/174; 455/265
[58] Field of Search ............ 358/188, 160, 174, 21 R, 358/23, 148, 195.1, 198; 455/260, 265; 329/122, 124

[56] References Cited

U.S. PATENT DOCUMENTS 4,633,315 12/1986 Kasperkovitz ...................... 358/188
4,642,675 2/1987 Gassmann ........................... 358/188

FOREIGN PATENT DOCUMENTS 0062872 10/1982 European Pat. Off. .
0122657 10/1984 European Pat. Off. .
0180339 5/1986 European Pat. Off. .
0201092 11/1986 European Pat. Off. .
2905321 8/1980 Fed. Rep. of Germany .
1565899 4/1980 United Kingdom .
2170368 7/1986 United Kingdom .

OTHER PUBLICATIONS

Proceedings of the IRE, "A Third Method of Generation and Detection of Single-Sideband Signals", Donald K. Weaver, Jr., pp. 1703-1705, Dec. 1956.

Primary Examiner—Tommy P. Chin
Attorney, Agent, or Firm—T. L. Peterson

[57] ABSTRACT

A frequency converter circuit for television signals is disclosed which contains a tuner and a low-IF converter which converts the television signal to a low IF signal to obtain adjacent-channel selectivity with low-pass filters. The low-IF converter further includes a phase-correcting stage and an amplitude-correcting stage for the two quadrature-signal paths. By digitizing the two signal paths after the first quadrature mixing process, their amplitude and phase stability is further improved.

15 Claims, 3 Drawing Sheets

FREQUENCY CONVERTING APPARATUS FOR CONVERTING AN RF TELEVISION SIGNAL TO A VIDEO SIGNAL EMPLOYING LOW IF TECHNIQUES

BACKGROUND OF THE INVENTION

The present invention relates to apparatus for converting the frequency of a radio-frequency television signal to the video band by means of a low IF technique.

Prior art apparatus for conversion usually contain a converter, also called "tuner", which converts a signal from the antenna, which may have been preamplified, to a fixed intermediate-frequency (IF) band of, e.g., 33.4 MHz to about 40 MHz. Adjacent-channel signals are rejected by an IF bandpass filter, whose bandpass and stop band have close tolerances in accordance with the respective television standard, so that the signals on adjacent channels, particularly adjacent sound carriers, will be rejected without distorting the picture and the sound to be reproduced. The slope of the selectivity characteristic of the IF bandpass filter is steep at the lower band limit at 33.4 MHz. At the upper band limit, there is a Nyquist slope for the picture carrier which has its 6-dB point at 38.9 MHz and then decreases constantly to about 40 MHz.

A filtering technique suitable for monolithic integration is referred to as the low-IF method. Using this method adjacent-channel selectivity is obtained by simple low-pass filtering in the baseband instead of the above described bandpass filtering at the intermediate frequency. To do this, however, the radio-frequency television signal must be down-converted in two exactly identical signal paths, with the signals on the two signal paths being exactly in quadrature. The principle of this method is described, for example, by D. K. Weaver, "A Third Method of Generation and Detection of Single-Sideband Signals", Proceedings of the IRE, 1956, pp. 1703-1705. Thus, as one can see from referring to the above-noted IRE article, there is presented a method of generation and detection of a single sideband signal. The method is basically different from either the conventional filter or phasing methods in that no sharp cutoff filters or wide band 90° phase difference networks are required. The system described in that article is especially suited to keeping the signal energy confined to the desired bandwidth. Any unwanted sideband occupying the same band as the desired sideband, and the unwanted sideband in the usual sense are not present. As can be seen from the article, the system basically takes an input signal and applies it to the two signal paths, each path contains a balanced modulator. One modulator receives the cosine signal while the other modulator receives the sine signal. The outputs of the modulators are respectively passed through low-pass filters and directed to two additional balanced modulators where these modulators receive the sine and cosine in quadrature of a translating signal. The outputs of the two modulators are then applied to a summing circuit where the output signal or the processed signal is obtained. The article describes the mathematics for operation of the circuit, including a single sideband generator which is shown in FIG. 7 of the article.

In any event, this technique has been adopted and is employed for converting an RF television signal to a video signal.

A circuit arrangement for television signals which are converted to the video band by the low-IF method as described is the subject matter of U.S. Pat. No. 4,633,315. According to that patent there is described a circuit arrangement for converting the frequency of a radio frequency television signal to the video band. Essentially the circuit has first and second signal input paths which are connected together at the input end. Each path contains a first multiplier whose output is connected to an associated low pass filter whose output is connected to a second multiplier. The outputs of the second multipliers in each path are connected to an adding stage. There is a phase correcting stage and an amplitude correcting stage which serves to establish the quadrature phase relationship between the signals applied to the respective first and second signal paths.

Essentially, the first multipliers in each path are fed with a first quadrature translation signal to provide at the outputs of these multipliers the low IF output signal. The second multipliers in each path are fed with a second quadrature translation signal. The frequency of the first translating signal lies within the band limits of the signals applied to the two signal paths where the pass bands of the first and second low pass filters are at least equal to half the bandwidth of the video signal. When this method is used for television signals the advantages associated with the filtering are offset by the fact that very stringent requirements are placed on the accuracy of the amplitude equality and on the accuracy of the 90° phase difference between the two signal paths. Hence, even small phase deviations of a few degrees will result in moire interference in the reproduced television picture. This is because the picture carrier cannot be completely suppressed by the low IF method and will beat with picture or sound signals to produce sound or picture interference resulting in a moire pattern.

It is, therefore, an object of the present invention to improve and optimize the above described apparatus to eliminate the described problems.

BRIEF DESCRIPTION OF PREFERRED EMBODIMENT

According to this invention, the radio-frequency television signal is converted to a fixed intermediate-frequency band by means of a tuner, and that adjacent-channel selectivity is obtained by then employing the low IF method by operating on the output signal of the tuner. One advantage achieved is that the critical radio-frequency downconversion is performed in a single mixer, while the sensitive quadrature mixing process takes place in a lower, uncritical frequency range. In addition, the quadrature mixing process is implemented in a closely limited frequency range which further contributes to stabilization. This is because the two quadrature signals necessary for the conversion are fixed-frequency signals, and the television signals to be mixed therewith lie within a fixed intermediate-frequency channel. Amplitude and phase equality of the individual subcircuits is thus easier to realize. Thus one can employ conventional monolithic integrated circuits, as no additional alignment processes are necessary.

BRIEF DESCRIPTION OF FIGURES

The invention will now be explained in more detail with reference to the accompanying drawings, in which.

DETAILED DESCRIPTION OF THE FIGURES

Figure 1:
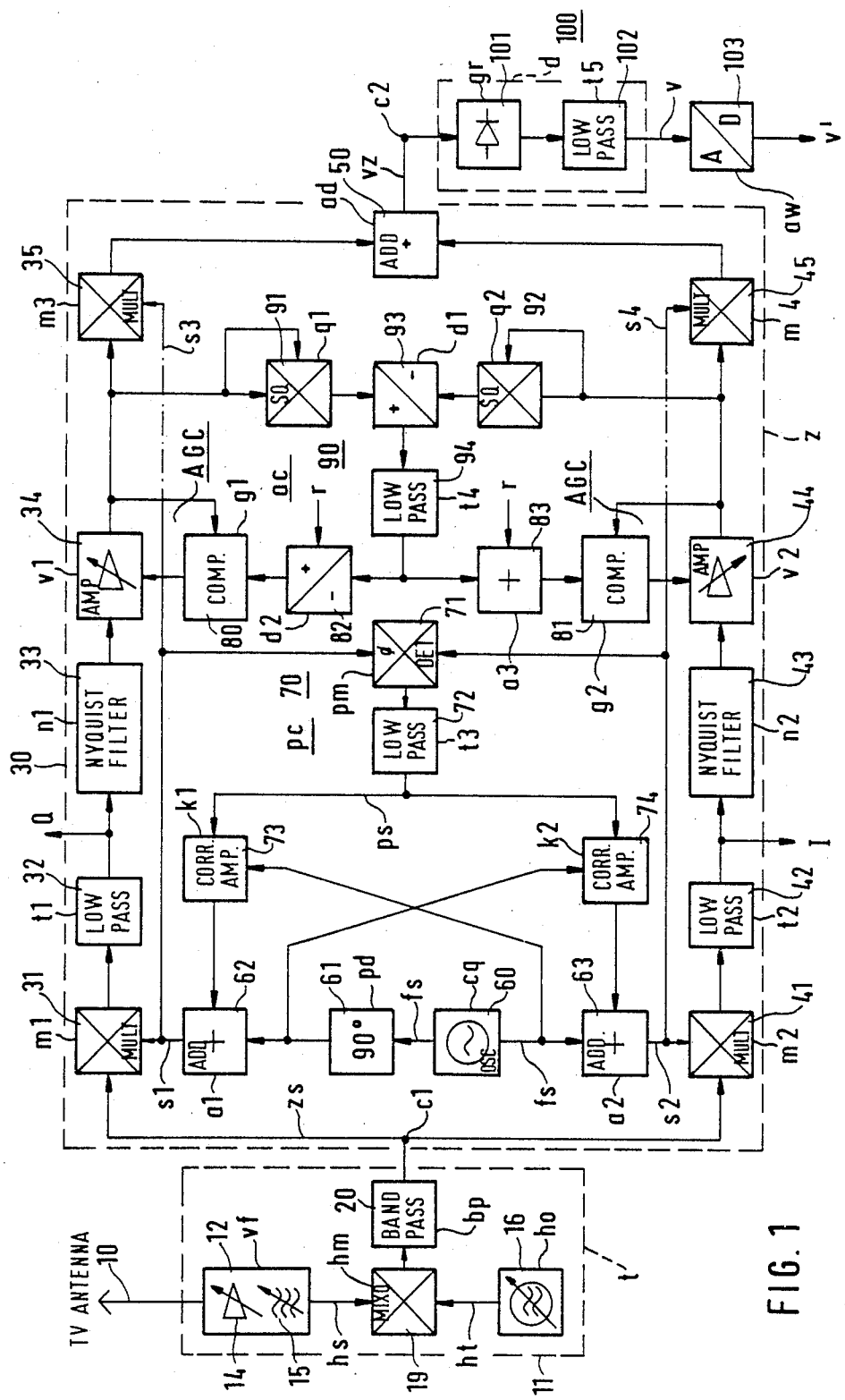
FIG. 1 is a block diagram of an embodiment of a frequency converter apparatus according to this invention.

In FIG. 1 the output RF television signal from antenna 10 is applied to the input of a television tuner 11, (t) whose input circuit 12 (vf) contains an amplifier 14 and a filter 15. The tuner 11 further includes the local RF oscillator 16 (ho) whose output signal ht feeds one of the inputs of a mixer 19 (hm). The other input of mixer 19 has the RF television signal hs applied thereto. The filtering serves to reject the image-frequency signal ss, cf. of FIG. 2. The output of the mixer 19 (hm) is filtered by means of the bandpass filter 20 (bp) and appears as an intermediate-frequency signal zs on the input c1 to the low-IF converter 30 (z).

The input c1 is coupled to two signal paths. The first signal path contains the series combination of a first multiplier 31 (m1), a first low-pass filter 32 (t1), a first Nyquist filter 33 (n1), a first variable-gain amplifier 34 (v1), and a third output multiplier 35 (m3). The second signal path is exactly identical to the first and contains the series combination of a second multiplier 41 (m2), a second low-pass filter 42 (t2), a second Nyquist filter 43 (n2), a second variable-gain amplifier 44 (v2), and a fourth multiplier 45 (m4).

The outputs of the first and second signal paths, i.e., the outputs of the third and fourth multipliers 35 and 45 (m3 m4), are applied respectively to the first and second inputs of an adding stage 50 (ad). The signal provided at the output of adder 50 is the video signal vz at an intermediate frequency which is also the output signal of the low-IF converter at the output c2. The first and second multipliers 31 and 41 (m1, m2) constitute portions of the first quadrature mixer in the input section of the low-IF converter 30 (z).

The first quadrature mixer further includes an oscillator 60 (cq), providing at an output the fixed-frequency signal fs. This signal is applied through the series combination of the 90° phase shifter 61 (pd) and a first adder 62 (a1) to the second input of the first multiplier 31 (m1). The fixed-frequency signal fs is also applied through a second adder 63 (a2) to a second input of the second multiplier 41 (m2). The two adders 62,63 (a1, a2) are included in the first quadrature mixer as parts of the phase-correcting stage 70 (pc), which further comprises the phase detector 71 (pm), a third low-pass filter 72 (t3), and two correction amplifiers 73 and 74 (k1, k2).

The phase-correcting stage 70 (pc) monitors the exact 90° phase difference between the first and second translating signals s1, s2 and varies (changes) the phases of the two signals by means of correction signals applied to the second inputs of the first adder 62 (a1) and the second adder 63 (a2), respectively. The phase detector 71 (pm) is a multiplier whose two inputs are fed with the first translating signal s1 and the second translating signal s2, respectively, and whose output is low-pass-filtered to give the phase correction signal ps, whose sign and magnitude are a measure of the deviation of the phase difference from the desired 90° value. Such techniques are well known in the art.

The phase correction signal ps is used to produce two correction signals which differ in phase from the respective translating signals s1, s2 by 90°. This is achieved by means of the first and second correction amplifiers 73 and 74 (k1, k2), which are formed in this embodiment by one multiplier each. One input of each of the correction amplifiers is fed with the phase correction signal ps; the other input of the correction amplifier 73 (k1) is fed with the fixed-frequency signal fs directly, while that of the correction amplifier 74 (k2) is fed with a signal shifted by 90° in the phase shifter 61 (pd). The outputs of the first and second correction amplifiers 73, 74 (k1, k2) feed the second inputs of the first adder 62 (a1) and the second adder 63 (a2), respectively.

As a result of the cross connection just described, signals separated in phase by 90° are thus applied to the two inputs of the first adder 62 (a1), with the magnitude of the correction signal being generally small compared to the magnitude of the signal at the other input, which corresponds to the first translating signal s1.

The magnitude of the correction signal at the second adder 63 (a2) is also small compared to that of the fixed-frequency signal fs, which corresponds to the second translating signal s2.

Since the phase-correcting stage 70 (pc) for obtaining the desired phase position is based on a zero control of the two correction signals, the two correction amplifiers 73, 74 (k1, k2) may also have nonlinear characteristics. However, it should be pointed out that all signals from the phase-correcting stage 70 (pc), with the exception of the low-pass-filtered phase correction signal ps, are signals of a single frequency, but of different phase. The frequency is that of the fixed-frequency signal fs.

Figure 3:
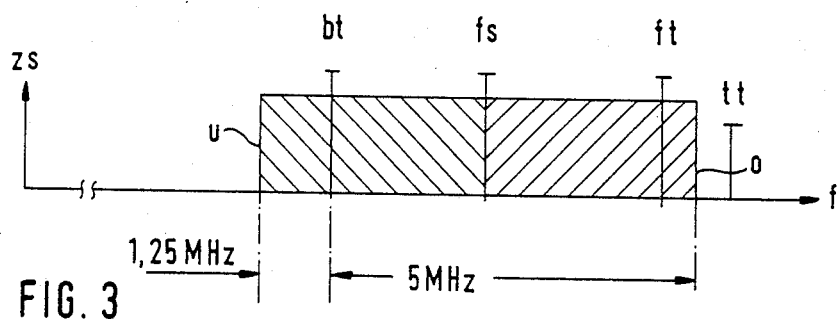
FIG. 3 is a graph depicting the frequency spectrum of the television signal at the output of the tuner.

FIG. 3 shows schematically the frequency spectrum of the intermediate-frequency signal zs with the picture carrier bt, the color carrier ft, and the sound carrier tt contained therein. In the first quadrature mixture of the low-IF converter z, the intermediate-frequency signal zs is converted to the low IF, namely the baseband, such that it appears "folded" about 0 Hz. This is achieved by placing the frequency of the oscillator 60 (cq) between the picture carrier bt and the color carrier ft, cf. the fixed-frequency signal fs in FIG. 3.

The output of the first multiplier 31 (m1) is coarsely filtered in the first low-pass filter 32 (t1) to give the folded quadrature-phase signal Q. Similarly, the output of the second multiplier 41 (m2) is coarsely low-pass-filtered by filter 42 to give the folded in-phase signal I.

Since the fixed-frequency signal fs, used as a translating signal in the first quadrature mixing process, lies in the middle of the intermediate-frequency signal zs, it is transformed into the frequency origin, i.e., 0 Hz, as is well known. Thus, the portion of the intermediate-frequency signal zs originally lying below the fixed-frequency signal fs is folded about the frequency origin, and extends into the positive frequency range. The ambiguity of the in-phase and quadrature-phase signals I, Q can be resolved as described by Weaver in the above reference.

The first and second Nyquist filters 33 and 43 (n1, n2) are necessary because of the vestigial-sideband-transmitted television signal. The 6-dB point of the Nyquist filter is chosen so that in the two folded signals I, Q, the folded picture carried bt' is at this frequency. The first and second Nyquist filters 33 and 43 (n1, n2) are actually low-pass filters whose slopes in the range of the upper cutoff frequency are Nyquist slopes.

Each of the two Nyquist filters 33, 43 (n1, n2) is followed by an associated automatic gain control stage (AGC) which is designed as a control loop. The loop following the Nyquist filter 33 (n1) contains the first variable-gain amplifier 34 (v1) and a first comparator 80 (g1), and the loop following the second Nyquist filter 43 (n2) contains the second variable-gain amplifier 44 (v2) and a second comparator 81 (g2). Each of the comparators 80 and 81 (g1, g3) compares the output of the associated variable-gain amplifier 34, 44 (v1, v2) with the reference signal r and changes the gain accordingly (see FIG. 1). The reference signal r is a d.c. signal to specify a threshold for the two comparators 80 and 81.

The reference signal r is applied to the two comparators 80 and 81 (g1, g2) through a subtracter 82 (d2) in the case of the first comparator 80 (g1) and through an adder 83 (a3) in the case of the second comparator 81 (g2). These two stages are parts of the amplitude-correcting stage 90 (ac), which further includes two squarers 91 and 92 (q1, q2), a first subtractor 93 (d1), and a fourth low-pass filter 94 (t4). The amplitude-correcting stage 90 (ac) changes the magnitude of the reference signal r additively or subtractively by the correction value in opposite directions for the two signal paths.

Amplitude equality is achieved by the method in which the mean difference of the squares of equal-amplitude sinusoidal signals becomes zero. The output of the first squarer 91 (q1), which is connected to the first signal path, feeds the minuend input of the subtracter 93 (d1), and the output of the second squarer 92 (q2), which is connected to the second signal path feeds the subtrahend input. The output of the subtracter 93 (d1) is smoothed by the fourth low-pass filter 94 (t4) and represents the correction signal which is fed to the subtrahend input of the subtracter 82 (d2) and to the second input of the adder 83 (a3). In this manner the reference signal r is decreased by the correction value of the first signal path, and increased by the correction value for the second signal path.

The second frequency conversion required takes place in the third and fourth multipliers 35 and 45 (m3, m4). The third translating signal s3, used for the frequency conversion in the first signal path, and the fourth translating signal s4, used for the frequency conversion in the second signal path, have the same frequency but differ in phase by 90°. If this frequency is suitably chosen, the frequency conversion, as is well known, leads directly into the video band, so that further demodulation can be dispensed with. That is the case, for example, if the folded picture carrier bt' is transformed into the frequency origin by the frequency conversion.

In the embodiment shown in FIG. 1, it is indicated by the dash-dotted lines that the third translating signal s3 and the fourth translating signal s4 may also be identical with the first translating signal s1 and the second translating signal s2, respectively. There signals are precisely in quadrature, as described above. In that case, the outputs of the two multipliers 35 and 45 (m3, m4) are no longer in the video band, but about 40 MHz above this band. Therefore, the low-IF converter z is followed by the detector 100 (d), which in the simplest case contains the rectifier 101 (gr) followed by a low-pass filter 102 (t5). The output provides the analog video signal v in the video band, which is converted by the analog-to-digital converter 103 (aw) into a digitized video signal v' for further digital signal processing. The analog video signal v and, of course, the digital video signal v' must not contain any sound components. The latter are sufficiently attenuated either in the first and second Nyquist filters 33 and 43 (n1, n2) or in the low-pass filter 102 (t5) or in a filter circuit (not shown) known as "sound trap", through which the analog video signal v is passed. Such "sound traps" are known in the television art.

The quadrature-phase signal Q and the in-phase signal I are tapped off and fed to a sound demodulator stage (not shown in FIG. 1). The taps are located ahead of the two Nyquist filters 33 and 43 (n1, n2) because the folded sound carrier tt' may already have been sufficiently attenuated by the Nyquist slope. The passband of each of the first and second low-pass filters 32 and 42 (t1, t2) is at least equal to half the bandwidth of the video signal v, e.g., 3.5 MHz, so that the in-phase signal I and the quadrature-phase signal Q will not be limited. The first and second low-pass filters 32 and 42 (t1, t2) provide only relatively coarse preselection.

If a first analog-to-digital converter is inserted between the output of the first low-pass filter 32 (t1) and the tap for the quadrature-phase signal Q, and a second, like analog-to-digital converter between the output of the second low-pass filter 42 (t2) and the tap for the in-phase signal I, the following stages must be implemented as digital stages. Thus, the signal processing in both signal paths is independent of external interfering influences, such as temperature, electromagnetic interference, and other irregular phenomena, such as nonlinearities. Thus, identity in the design of the two signals paths is assured from the point of digitization. This includes the realizability of complex digital filter structures which, as analog filters, are not suitable for monolithic integration.

With respect to the subsequent digitization, the first and second low-pass filters 32, 42 (t1, t2) are pure anti-aliasing filters, which, as is well known, suppress frequency components in the analog signal which are higher than half the sampling frequency of the digitization. In the signal band proper, however, the anti-aliasing filters have no effect; they are fully transmitting. These two requirements are easily implemented with integrated subcircuits if the sampling frequency lies clearly above twice the maximum signal frequency, which is usually the case.

The third and fourth translating signals are then the digital outputs of the first and second digital variable-gain amplifiers, respectively. Thus, squaring and rectification are performed in both signal paths. The outputs of these two squarers are added in the digital adding stage, and a following digital root extractor extracts the square root of the sum value, and this square root represents the digitized television signal at the video band, which is thus the digitized video signal v'. The detector 100 (d) and the analog-to-digital converter 103 (aw) shown in the embodiment of FIG. 1 are then omitted. Here, too, any interfering sound components in the video signal must be filtered out prior to or after the digitization. Other digital signal processing techniques are known which can be used here to form absolute values and may eliminate the need for the squaring or the root extraction.

Figure 2:
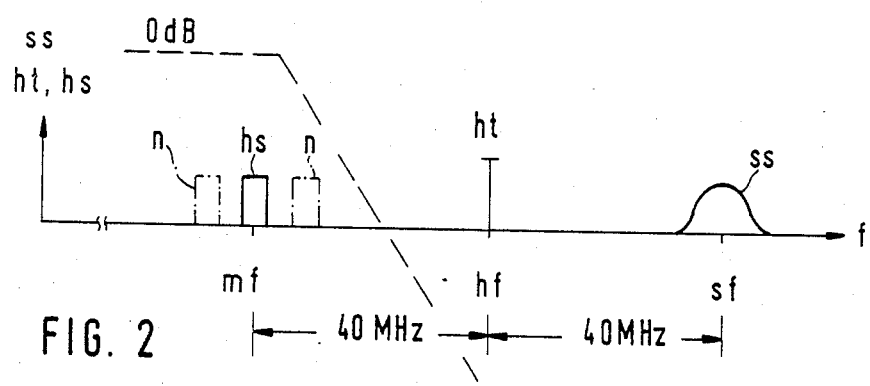
FIG. 2 is a graph showing the frequency spectrum of the radio-frequency television signal with two adjacent channels and the image-frequency signal.

From the frequency spectra of FIGS. 2 and 3 it is apparent that the signal ht from the local RF oscillator ho in the tuner t is placed 40 MHz from the RF television signal hs, whose channel width is about 7 MHz. The adjacent channel separation is 8 MHz, for example.

The dashed line in FIG. 2 indicates the approximate image-frequency rejection required in the tuner 11 (t). Since the frequency hf of the local-oscillator signal ht lies exactly in the middle between the center frequency mf of the RF television signal hs and the center frequency of the image-frequency signal ss of frequency sf or of a corresponding external signal, the two signals hs, ss fully cover each other after the frequency conversion and can no longer be separated. Therefore, the interfering image-frequency signal ss must be attenuated to a sufficiently low level prior to the radio-frequency mixing, namely by the image-frequency filter 15 in the input circuit vf. The intermediate-frequency signal zs in FIG. 3 and the fixed-frequency signal fs thus lie in the 40 MHz range. Then, the frequency of the fixed-frequency signal fs would be 36.3 MHz in the case of the PAL television standard. Two adjacent channels n are shown in FIG. 2 by dash-dotted lines.

Figure 4:
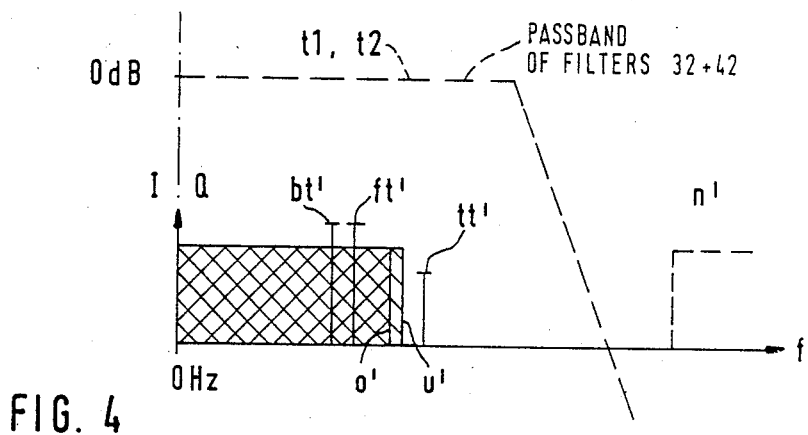
FIG. 4 is a graph depicting the frequency spectrum of the folded in-phase quadrature-phase signals at the low IF.

FIG. 4 shows the frequency spectrum of the in-phase signal I and the quadrature-phase signal Q, which are both folded. As in FIG. 3, the two sections defined by the fixed-frequency signal fs are hatched differently and show how they overlap after the folding. The lower limit u of the vestigial sideband becomes the transformed band limit u'. Correspondingly, the upper video-band limit o becomes the transformed upper band limit o'. In the case shown, the folded sound carrier tt' is separated from the folded picture carrier bt' at such a distance that the Nyquist slope of filters 33 and 43 referred to the folded picture carrier bt' attenuates the same to a sufficiently low level, so that it will not interfere with the picture reproduction. The passbands of the first and second low-pass filters 32 and 42 (t1, t2) are shown schematically by a dashed line, with the adjacent channel n' rejected as far as possible, while the signal of the desired station lies fully in the passband.

Figure 5:
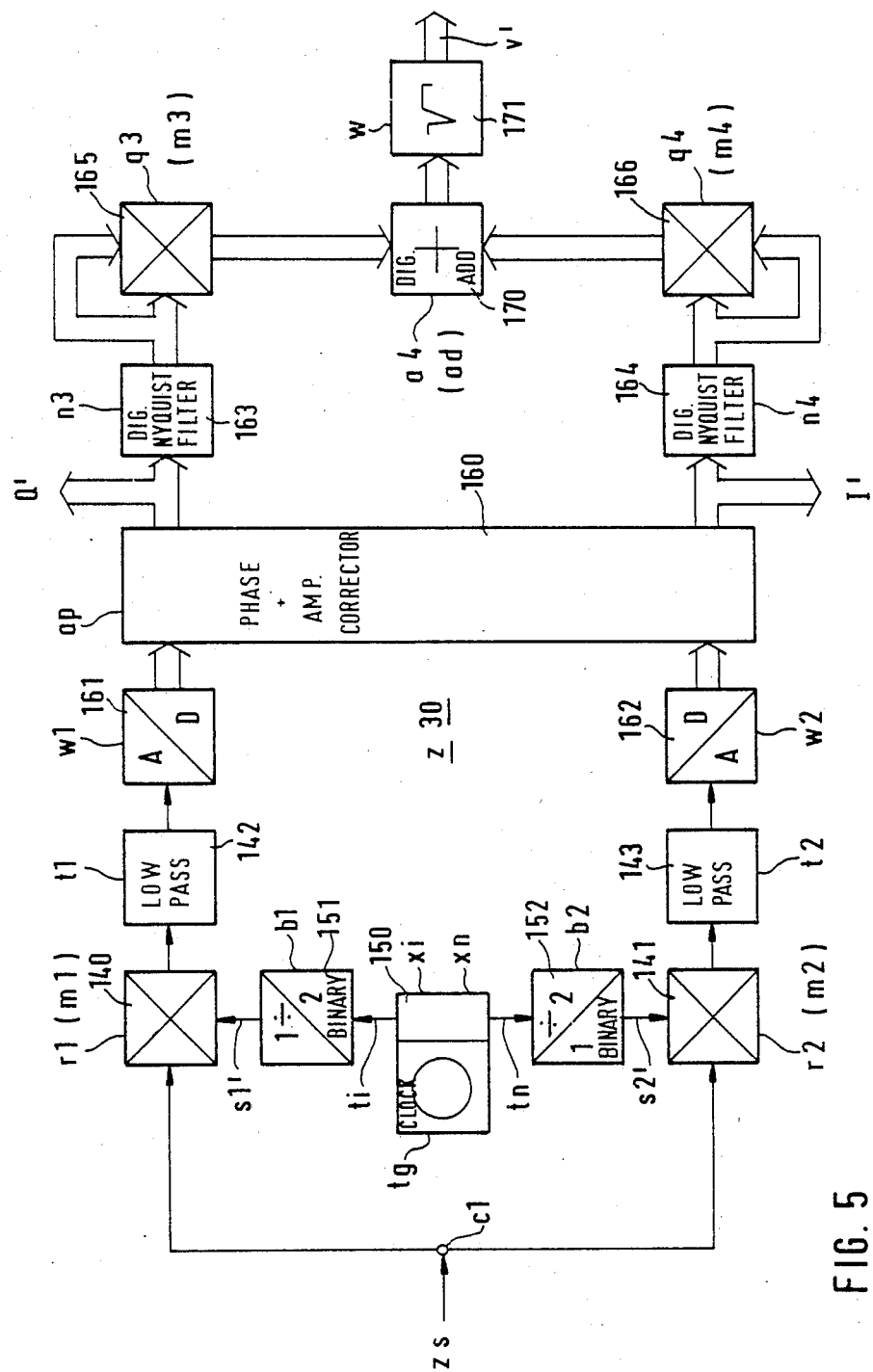
FIG. 5 is a block diagram of an alternate embodiment of the low IF converter according to this invention.

FIG. 5 shows a preferred embodiment of the low-IF converter z in a block diagram. The essential difference from the above-described examples lies in the fact that the first quadrature mixing process uses first and second ring modulators 140, 141 (r1, r2) instead of first and second multipliers 31 and 41 (m1, m2) of FIG. 1. The first and second translating signals s1, s2 thus serve to perform pure switching functions in the two ring modulators 140, 141 (r1, r2) and are therefore independent of their amplitudes. This facilitates the integrability of the first quadrature mixer, since two ring modulators of extremely close symmetry are easier to implement because of the pure switch mode operation. As switching signals, square-wave or steep-edge clock signals are better suited than sinusoidal translating signals as s1, s2 since they provide definite switching levels. Thus, the first and second clock signals s1' and s2', have mark/space ratios as close to 1:1 as possible and whose frequencies are equal to the frequency of the fixed-frequency signal ss. These signals are applied to the switch inputs of the first ring modulator 140 (r1) and the second ring modulator 141 (r2), respectively.

The use of ring modulators in the first quadrature mixer is possible because the intermediate-frequency signal zs is a band-limited signal. The third, fifth, etc. or odd harmonics of the fixed-frequency signal fs, which occur during ring modulation, generate no undesired mixer products as base-band. This is because no input signal is present at those harmonics. Higher-frequency mixer products (such as fs+hs) are filtered out by the following low-pass filters 142, 143 (t1, t2), which also act as anti-aliasing filters for the digitization. In designing the band-pass filter 20 (bp) (FIG. 1) in the tuner 11, the frequency of the fixed-frequency signals fs and the passband of the anti-aliasing filter (whose bandwidth depends on the digitization rate), must be taken into account.

The first and second clock signals s1', s2', which differ in phase by 90°, are generated by the clock generator 150 (tg), whose inverting output xi and noninverting output xn provide the inverted clock signal ti and the uninverted clock signal tn, respectively. These frequencies are equal to twice the frequency of the first or second clock signal s1', s2' and, thus, equal to twice the frequency of the fixed-frequency signal fs, the mark/space ratio being 1:1. The inverted and uninverted clock signals ti, tn are applied to the first and second single-stage binary frequency dividers 151, 152 (b1 and b2), respectively, whereby the clock frequency is halved to establish the 90° phase relationship between the first and second clock signals s1', s2'. The circuits 151 and 152 are ordinary bistable multivibrators.

Unlike in FIG. 1, the phase correcting stage 70 (pc) and the amplitude-correcting stage 90 (ac) are combined in a single digital circuit, namely in the phase- and amplitude-correcting stage 160 (ap). The latter is inserted in the two signal paths between the first analog-to-digital converter 161 (w1) and the tap for the digital quadrature-phase signal Q' and between the second analog-to-digital converter 162 (w2) and the tap for the digital in-phase signal I'. An embodiment of this correcting circuit is described in our co-pending U.S. application Ser. No. 22,833 filed Mar. 6, 1987. There, a control circuit is disclosed for controlling the phase difference and the amplitudes of two digital signals separated in phase by about 90°.

The two phase- and amplitude-controlled digital signals of the two signal paths are applied to a first digital Nyquist filter 163 (n3) and a second digital Nyquist filter 164 (n4), respectively, which may also contain the sound signal suppression circuitry for the subsequent picture-signal processing. The outputs of the first and second digital Nyquist filters 163, 164 (n3 and n4) are squared by a squarer 165 (q3) and the squarer 166 (q4), respectively, and the two squared values are summed by the digital adding stage 170 (a4).

The output of the digital adding stage 170 (a4) is the squared and, thus, the rectified value of the digitized video signal at the video band, which is passed through the digital square-root extractor 171 (w) to obtain the digitized video signal v' at the video band. Thus, a separate detector 100 (d), as in FIG. 1, is no longer necessary. Computational demodulation by forming the absolute values of quadrature signals is very difficult to implement with analog devices. However, with digital techniques such circuits can be easily realized using monolithic integrated circuit techniques.

What is claimed is:

1. Frequency converting apparatus for converting an RF television signal to a video signal by employing a low IF processing apparatus which apparatus includes first and second signal paths each path containing a first multiplier for receiving at an input a television signal with each multiplier followed by a low pass filter having an output coupled to an input of a second multiplier in each path, with the first and second multiplier in each path receiving at other inputs respective quadrature sinusoidal signals as generated by a quadrature signal generator whereby said first path provides a first low IF quadrature signal at the output of said associated second multiplier and said second path provides a second low IF quadrature signal at the output of said associated second multiplier with the outputs of said second multipliers coupled to an adding circuit to provide said video signal at its output and including a phase and amplitude correcting means operative to provide properly phased quadrature signals of proper amplitude to assure the quadrature relationship in said first and second signal paths, in combination therewith of apparatus for improving said conversion to said video signal, comprising:

a Nyquist filter positioned in each signal path so that the output of said low pass filter in said first path is coupled to the input of a first Nyquist filter, with the output of said low pass filter in said second path coupled to the input of a second Nyquist filter, with the output of said first Nyquist filter coupled to the input of a first variable gain amplifier having a control terminal in said first path having the output coupled to the input of said second multiplier in said first path and with the output of said second Nyquist filter coupled to the input of a second variable gain amplifier having a control terminal in said second path whose output is coupled to the input of said second multiplier in said second path, with the output of each variable gain amplifier in each path also coupled to the input of an associated comparator in each path, for comparing the output of said associated variable gain amplifier with a derived correction signal at another input, with each control terminal of said variable gain amplifier coupled to the output of said associated comparator to vary the inputs to said associated second multipliers according to said derived correction signal and means coupled to the outputs of said first and second variable amplifiers for providing said derived correction signal.

2. The apparatus according to claim 1 wherein the 6 db frequencies of said first and second Nyquist filters are equal to the frequency of the folded picture carrier of said television signal as manifested by the output of said first multiplier in each path.

3. The apparatus according to claim 2 further including:

detecting means coupled to the output of said adding circuit for providing at an output a demodulated television signal.

4. The apparatus according to claim 1 wherein said means coupled to the outputs of said first and second variable amplifiers for deriving said correction signal comprises first and second squaring circuits, with said first squaring circuit having an input coupled to the output of said first variable gain amplifier and with said second squaring circuit having an input coupled to the output of said second variable amplifier with each said squaring circuit providing an output indicative of the square of the input, with the output of each said squaring circuit applied to a separate associated input of a subtraction circuit to provide a difference output signal, smoothing filtering means coupled to the output of said subtractor with the output of said filter coupled through first means to said other input of said comparator in said first path and through second means to said other input of said comparator in said second path.

5. The apparatus according to claim 4 wherein said first means includes subtractor means having the subtrahend input coupled to the output of said smoothing filter means and the minuend input adapted to receive a reference signal with the output of said subtractor coupled to said other input of said first path comparator.

6. The apparatus according to claim 5 wherein said second means includes an adder circuit having one input coupled to the output of said smoothing filter means and a second input adopted to receive said reference signal and with the output of said adder coupled to the other input of said second path comparator.

7. The apparatus according to claim 1 further including RF tuner means responsive to said RF television signal to provide at an output an intermediate frequency television signal indicative of said television signal as applied to said first multiplier input of each of said signal paths.

8. The apparatus according to claim 1 wherein said quadrature signal generator includes an oscillator having an output coupled to a first input of a first signal adder means including a 90° phase shifter and having an output coupled to said other input of said first multiplier in said first path; with the output of said oscillator coupled to a first input of a second signal adder means having the output coupled to said other input of said first multiplier in said second path, with the other input of said first and second signal adders coupled to associated first and second correction amplifying means each having first and second inputs, a phase detector means having one input coupled to the output of said first signal adder and another input coupled to the output of said second signal adder, with the output of said phase detector means coupled to said first input of said correction amplifying means, and with the second input of said first correction amplifying means of said first signal path coupled to the output of said oscillator and with the second input of said second correction amplifying means coupled to the output of said 90° phase shifter to cause said first and second signal adders to provide a phase varying signal to said associated multipliers indicative of proper phased quadrature signals at said other inputs.

9. The apparatus according to claim 3 further including an analog to digital converter having an input coupled to the output of said detecting means for providing at an output a digitized television signal.

10. The apparatus according to claim 4 wherein said smoothing filtering means is a low pass filter.

11. Apparatus for converting a R.F. television signal to a video signal said apparatus including a tuner for receiving said RF television signal and for providing at an output an intermediate frequence (IF) television signal, comprising:

a clock source for generating at an output a given frequency signal;

digital dividing means coupled to said clock source for providing at a first output a divided clock signal of a given phase and at a second output a divided clock signal of a 90° phase;

a first switching modulator having one input adapted to receive said IF signal and one input coupled to said first output of said dividing means;

a second switching modulator having one input adapted to receive said IF signal and one input coupled to said second output of said switching means;

a first low pass filter having an input coupled to the output of said first modulator and a second low pass having an input coupled to the output of said second demodulator;

a first analog to digital converter having an input coupled to the output of said first low pass filter;

a second analog to digital converter having an input coupled to the output of said second low pass filter;

a filter digital Nyquist filtering means having an input coupled to the output of said first analog to digital converter;

a second digital Nyquist filtering means having an input coupled to the output of said second analog to digital converter;

a first squaring means coupled to the output of said first Nyquist filtering means and a second squaring means coupled to the output of said second Nyquist filtering means, with the outputs of said first and second squaring means coupled to respective inputs of a digital summing means for providing at an output a digital signal of a squared value indicative of a video signal; and a square root extractor means coupled to the output of said digital summing means to obtain a digitized video signal in the video band.

12. The apparatus according to claim 11 wherein said first and second modulators are ring modulators.

13. The apparatus according to claim 11 further including:

digital phase and amplitude correcting means coupled to the outputs of said first and second analog to digital converters and operative to provide amplitude and phase correction to said digital output signals from said converters.

14. The apparatus according to claim 11 wherein said digital dividing means includes a binary multivibrator.

15. The apparatus according to claim 11 wherein said divided clock signals have relatively equal ON and OFF durations.

* * * * *